(12) United States Patent
Fan et al.

(10) Patent No.: US 6,881,640 B2
(45) Date of Patent: Apr. 19, 2005

(54) FABRICATION METHOD FOR HETEROJUNCTION BIPOLAR TRANSISTOR

(75) Inventors: Cheng-Wen Fan, Hsin-Chu Hsien (TW); Hua-Chou Tseng, Hsin-Chu (TW)

(73) Assignee: United Microelectronics Corp., Hsin-chu (TW)

( * ) Notice: Subject to any disclaimer, the term of this patent is extended or adjusted under 35 U.S.C. 154(b) by 47 days.

(21) Appl. No.: 10/655,696

(22) Filed: Sep. 5, 2003

(65) Prior Publication Data

US 2005/0051797 A1 Mar. 10, 2005

(51) Int. Cl.⁷ .................................... H01L 21/331
(52) U.S. Cl. .............................. 438/312; 438/321
(58) Field of Search ........................ 438/312, 320, 438/321, 309, 317

(56) References Cited

U.S. PATENT DOCUMENTS

| | | | |
|---|---|---|---|
| 6,384,469 B1 | * | 5/2002 | Chantre .................. 257/565 |
| 6,812,107 B1 | * | 11/2004 | Schuegraf ................ 438/321 |
| 2004/0135179 A1 | * | 7/2004 | Kalburge et al. ........... 257/273 |

* cited by examiner

Primary Examiner—Tuan H. Nguyen
(74) Attorney, Agent, or Firm—Squire, Sanders & Dempsey

(57) ABSTRACT

A fabrication method for heterojunction bipolar transistor is disclosed. The method uses ISSG oxide instead of conventional PECVD oxide so that the base/emitter interface damage can be reduced. Moreover, the invention replaces the conventional emitter-window/space mask with an emitter-window reverse-tone mask/line mask to minimize the critical dimension of emitter window. Furthermore, the invention also utilizes a two-steps extrinsic base implantation to form two extrinsic bases with different dopant concentrations so that the base resistance can be reduced.

16 Claims, 10 Drawing Sheets

FABRICATION METHOD FOR HETEROJUNCTION BIPOLAR TRANSISTOR

BACKGROUND OF THE INVENTION

1. Field of the Invention

The present invention relates to a fabrication method for heterojunction bipolar transistor (HBT), and more particularly to a fabrication method for heterojunction bipolar transistor (HBT) emitter/emitter window by a reverse-tone approach.

2. Description of the Related Art

Transistors are multi-electrode semiconductor devices in which the current flowing between two specified electrodes is controlled or modulated by the voltage applied at a third (control) electrode. Transistors fall into two major classes: the bipolar junction transistor (BJT) and the field-effect transistor (FET). BJTs were derived from the point-contact transistor, which was invented at Bell Telephone Laboratories in 1947 by Bardeen, Brattain, and Shockley. BJTs comprise two p-n junctions placed back-to-back in close proximity to each other, with one of the regions common to both junctions. This forms either a p-n-p or n-p-n transistor comprising three regions—emitter, base and collector. The BJT utilizes the flow of both electrons and holes across the p-n junctions for its electrical behavior. That is, the current flow through the emitter and collector electrodes is controlled by the voltage across the base-emitter p-n junction.

In normal (or forward active) operation of a BJT, the base-emitter p-n junction is forward biased and the base-collector junction is reverse biased. Majority-carrier current flows across the forward-biased emitter-base junction. The emitter is much more heavily doped than the base region, so that most of the total current flow across the base-emitter junction consists of majority carriers from the emitter injected into the base. These injected carriers become minority carriers in the base region, and will tend to recombine. Such recombination is minimized by making the base region very narrow, so that the injected carriers can diffuse across the base to the reverse-biased base-collector junction, where they are swept across the junction into the collector, to appear in the outside circuit as the collector current. The magnitude of this collector current depends on the number of majority carriers injected into the base from the emitter, and thus current is controlled by the base-emitter p-n junction voltage. The output (collector) current is therefore controlled by the input (base-emitter) voltage, and the output circuit of the transistor can be modeled as a voltage-controlled current source (dependent sources), while the input circuit looks like a p-n junction diode.

In principle, the transistor can be operated in reverse active mode by reversing the connections. However, in practice, the transistor is not completely symmetrical. That is, the emitter is very heavily doped to maximize emitter injection, and the collector is relatively lightly doped so that it can accommodate large voltage swings across its reverse-biased junction. While the electrical characteristics are similar in appearance, the forward characteristics show much greater gain, as expected.

If both junctions are reverse biased, the transistor behaves like an open switch, with only the p-n junction reverse leakage currents flowing. If both junctions are forward biased, there is injection of carriers into the base region from both sides, and a low resistance is presented to current flow in either direction: the transistor behaves like a closed switch, and the base stores the injected charge.

BJTs can be used to provide linear voltage and current amplification: small variations of the base-emitter voltage and hence the base current at the input terminal result in large variations of the output collector current. Since the transistor output has the appearance of a current source, the collector can drive a load resistance and develop an output voltage across this resistance (within the limits of the supply voltage). The transistor can also be used as a switch in digital logic and power switching applications, switching from a high-impedance 'off' state in cut-off, to a low-impedance 'on' state in saturation. In practice, full saturation conditions of base-collector forward biased are generally avoided, to limit the carrier storage in the base and reduce the switching time. Such BJTs find application in analog and digital circuits and integrated circuits, at all frequencies from audio to radio frequency. For higher frequencies, such as microwave applications, heterojunction bipolar transistors (HBTs) are used.

HBTs are bipolar junction transistor which incorporate a wide band gap emitter, where the emitter-base junction is a heterojunction between semiconductors of different energy band gaps. The following are typical materials for HBTs: aluminum-gallium-arsenide (AlGaAs) (emitter)/gallium-arsenide(GaAs) (base); aluminum-indium-arsenide (AlInAs)/indiumgallium-arsenide (InGaAs); Si/silicon-germanium (SiGe); and indium-gallium-phosphide (InGaP)/GaAs; indium-phosphide (InP)/InGaAs.

However, conventional HBTs and the forming process thereof have several drawbacks. FIG. 1A to FIG. 1C show a conventional HBT process. Referring to FIG. 1A, a substrate 102 having a collector, a dielectric 104, a layer 106, a base layer 108, a dielectric layer 110, a hard mask layer 112, a BARC layer 114 and a photoresist layer 116 with a window pattern is shown. Then the BARC layer 114, the hard mask layer 112 and the dielectric layer 110 are etched by reactive ion etching (RIE) and wet dip processes to expose the base layer 108 as shown in FIG. 1B. Finally, an emitter 118 is formed and an extrinsic base region 120 is formed by an ion implantation process.

The above-mentioned process has several drawbacks. Firstly, the critical dimension control of the emitter window is hard and tough because the emitter window pattern is formed by a photo mask with a window/hole pattern which is hardly shrink, especially when the critical dimension control shrinks toward to 0.18 micron generation. Moreover, the emitter window pattern formed by the window/hole pattern tends to enlarge in a photolithography process. Furthermore, the emitter window formed by reactive ion etching and wet dipping the BARC layer 114, the hard mask layer 112 and the dielectric layer 110 will be further enlarged. Defects such as voids induced by RIE and wet dip will be formed between the emitter 118 and the base layer 108 after the emitter 118 is formed on the base layer 108.

Thus it is necessary to provide a new method to resolve the drawbacks set forth. It is towards those goals that the present invention is specifically directed.

SUMMARY OF THE INVENTION

It is therefore an object of the invention to provide a fabrication method for heterojunction bipolar transistor (HBT) which can reduce base/emitter interface damages.

It is another object of this invention to provide a fabrication method for heterojunction bipolar transistor (HBT) which utilizes an emitter-window reverse-tone mask/line mask to minimize the critical dimension of emitter window.

It is a further object of this invention to provide a fabrication method for heterojunction bipolar transistor (HBT) with a two-steps extrinsic base implantation to reduce base resistance.

To achieve these objects, and in accordance with the purpose of the invention, the invention uses a fabrication method for forming heterojunction bipolar transistor. The method comprises the following steps. First of all, a substrate having a collector therein, a base layer over the substrate, an oxide layer over the base layer, and a polysilicon layer over the oxide layer is provided. Then a first photoresist layer is formed over the polysilicon layer. Next a line pattern is transferred into the first photoresist layer by a photo mask with the line pattern to form an emitter window pattern. Then said polysilicon layer is etched to expose said oxide layer by using said emitter window pattern as an etching mask. Next a first ion implantation process is performed into said base layer to form a first extrinsic base region therein. Then said emitter window pattern is removed and a dielectric layer is formed over the polysilicon layer and the oxide layer. Next the dielectric layer is thinned to expose the polysilicon layer. Then the polysilicon layer is removed to expose the oxide layer. Next the exposed oxide layer is etched to expose the base layer. Then an emitter layer is formed over the base layer and the dielectric layer. Next a second photoresist layer is formed over the emitter layer. Then an emitter pattern is transferred into the second photoresist layer. Next the emitter layer is etched to form an emitter and expose the oxide layer by using the emitter pattern as an etching mask. Finally, a second ion implantation process is performed to form a second extrinsic base region.

In another embodiment of this invention, the invention uses another fabrication method for forming heterojunction bipolar transistor. The method comprises the following steps. First of all, a substrate having a collector therein, a base layer over the substrate, a first emitter layer over the base layer, and a first dielectric layer over the first emitter layer is provided. Then a first photoresist layer is formed over the first dielectric layer. Next a line pattern is transferred into the first photoresist layer by a photo mask with the line pattern to form a emitter window pattern. Then the first dielectric layer is etched to expose the first emitter layer by using the emitter window pattern as an etching mask. Next the emitter window pattern is removed and the first emitter layer is etched to expose the base layer. Then a first oxide layer is formed over the base layer and the first emitter layer. Next a second oxide is formed over the first dielectric layer and the first oxide layer. Then a first ion implantation process is performed into the base layer to form a first extrinsic base region therein. Next a second dielectric layer is formed over the second oxide layer. Then the second dielectric layer is anisotropically etching to expose the second oxide layer and form a spacer. Next a second ion implantation process is performed to form a second extrinsic base region. Then a third dielectric layer is formed over the second oxide layer and the spacer. Next the third dielectric layer is thinned to expose the second oxide layer. Then the exposed second oxide layer and the first dielectric layer are removed to expose the first emitter layer. Next a second emitter layer is formed over the first emitter layer and the third dielectric layer. Then a second photoresist layer is formed over the second emitter layer. Next an emitter pattern is transferred into the second photoresist layer and the second emitter layer, the third dielectric layer, the second oxide layer and the first oxide layer are etched to form an emitter and expose the second extrinsic base region.

The invention provides a heterojunction bipolar transistor comprising a substrate having a collector therein, an intrinsic base region, a first extrinsic base region, a second extrinsic base region, an emitter on the intrinsic base layer and a spacer adjacent the emitter and on the first extrinsic base region. The first extrinsic base region is adjacent the intrinsic base region and the second extrinsic base region is adjacent the first extrinsic base region on the substrate, wherein a dopant concentration of the second extrinsic base region is higher than a dopant concentration of the first extrinsic base region.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structure. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
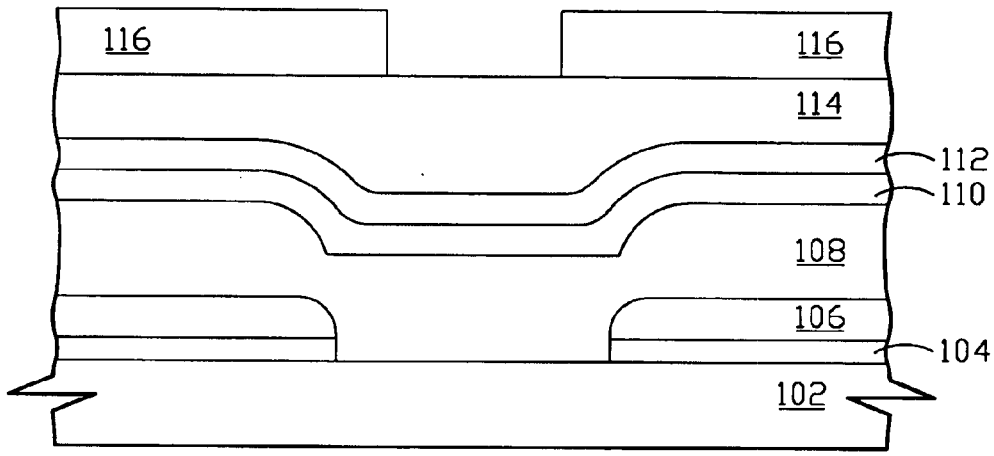
FIG. 1A to FIG. 1C show a process flow of a conventional HBT, process.
Figure 1B:
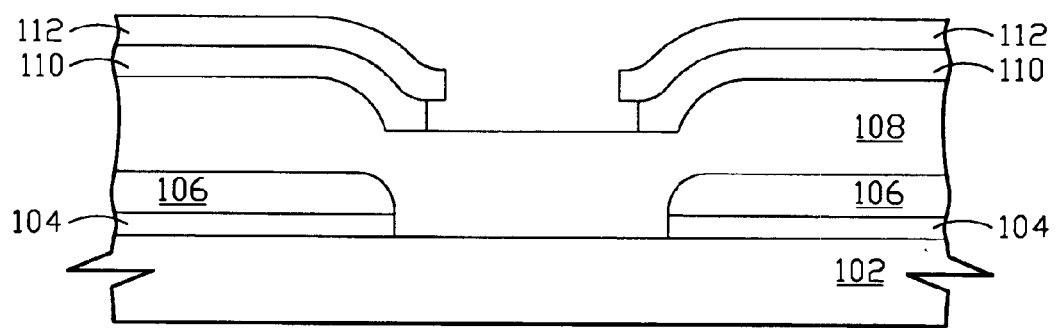
Figure 1C:
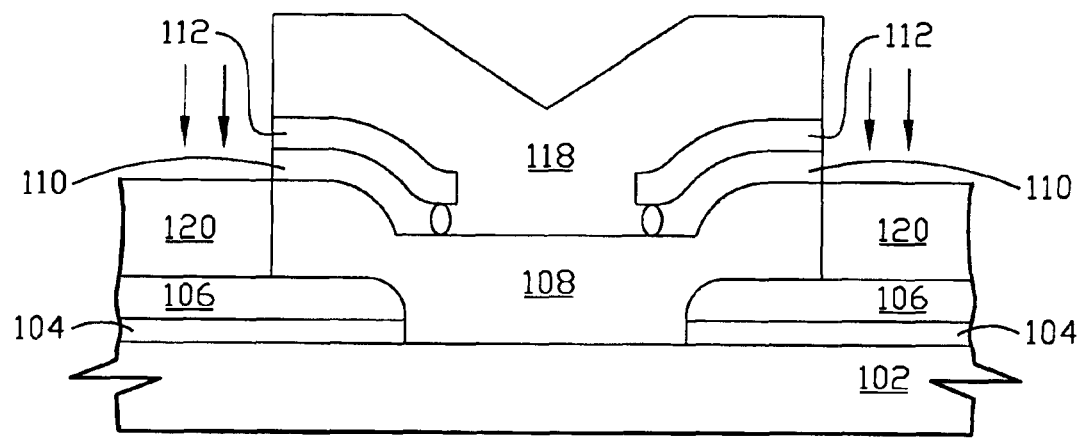
Figure 2A:
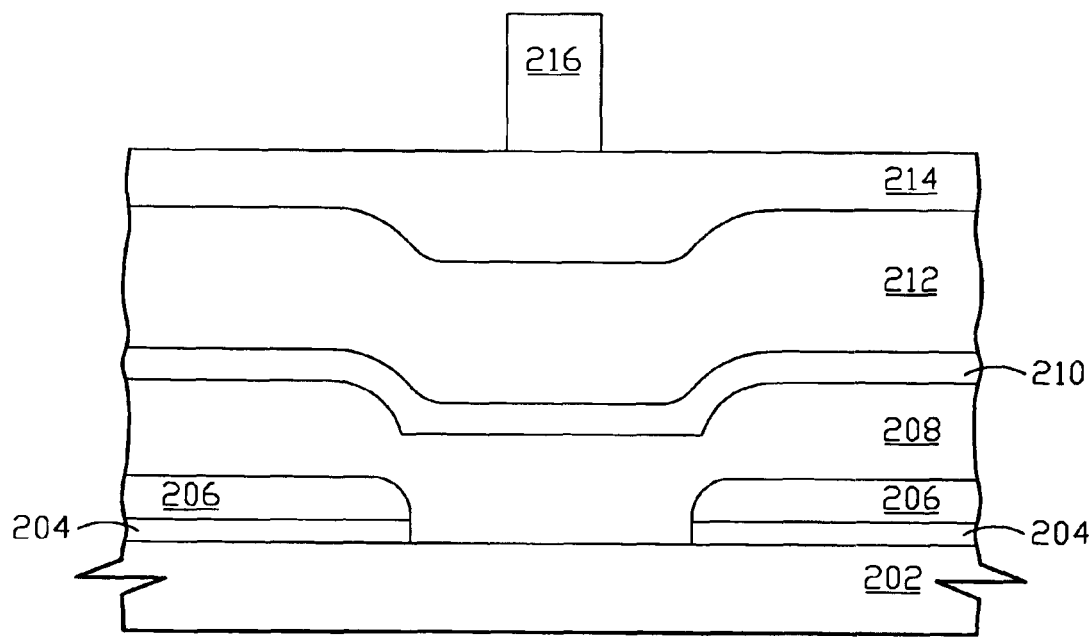
FIG. 2A to FIG. 2H show process steps of one embodiment this invention.

Referring to FIG. 2A, a substrate 202 having a collector therein is firstly provided. The substrate 202 comprises a p-type epitaxial silicon substrate. Then a dielectric layer 204 and a layer 206 are sequentially formed on the substrate 202. The layer 206 comprises a polysilicon layer. Next a window is formed to expose the substrate 202 by patterning and etching the dielectric layer 204 and the layer 206. Then a base layer 208 is formed over the layer 206 and to fill the window. The base layer 208 comprises a silicon germanium (SiGe) layer. Next an oxide layer 210 is formed over the base layer 208. The oxide layer 210 comprises an in situ steam generation (ISSG) oxide layer grew on a SiGe layer. The oxide layer 210 is used as a gate oxide layer. Then a layer 212 is formed on the oxide layer 210. The layer 212 comprises an undoped polysilicon layer. Next a bottom anti-reflecting coating (BARC) layer 214 is formed over the layer 212. Finally, a photoresist layer is formed on the BARC layer 214 and is patterned to form a line pattern 216. The line pattern 216 is formed by using a reverse-tone mask. The reverse-tone mask comprises photo masks used to expose photoresist layers and form line patterns of circuit lead line of integrated circuit. Since the line pattern 216 is a result of removing most of the photoresist layer after a developing process and is used as an etching mask, the line pattern 216 tends to decrease its size during exposing and developing processes. Moreover, a line pattern scale are much easier to be decreased than a window pattern scale or a hole pattern scale since the line pattern covers and protects the device (such as a lead line) to be formed from the etchant while the window pattern or the hole pattern expose the device (such as a contact window or a hole) to be formed to the etchant during etching, and the etching mechanism tends to remove more material than demand. Therefore, it is much easier to decrease the scale of emitter window by using a reverse-tone mask or a photo mask for line pattern.

Figure 2B:
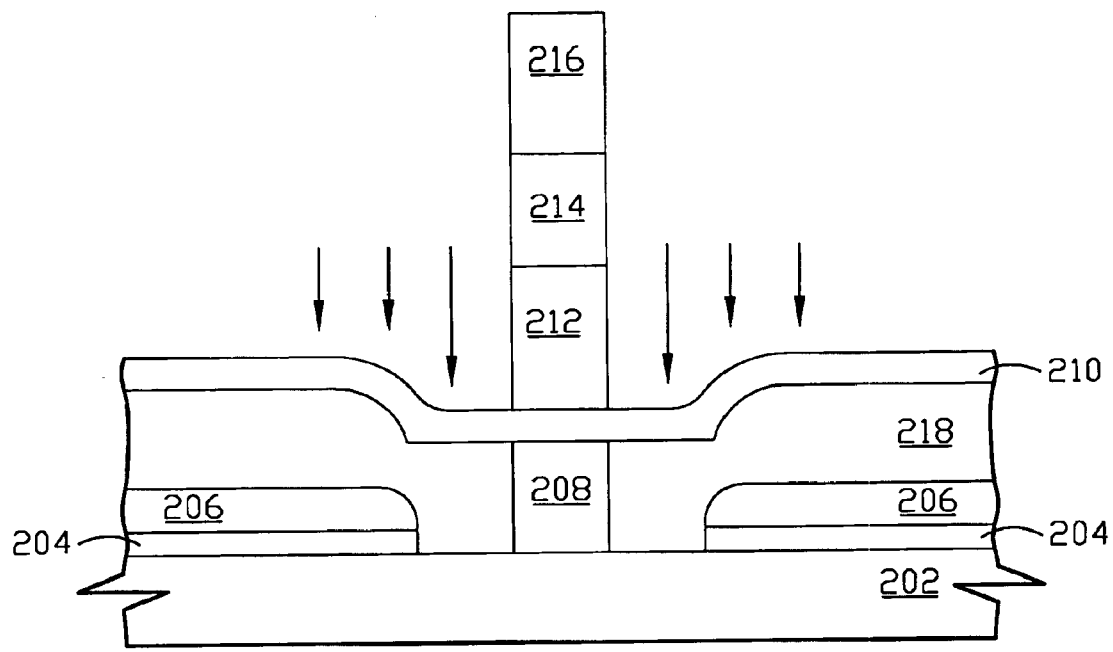
Figure 2C:
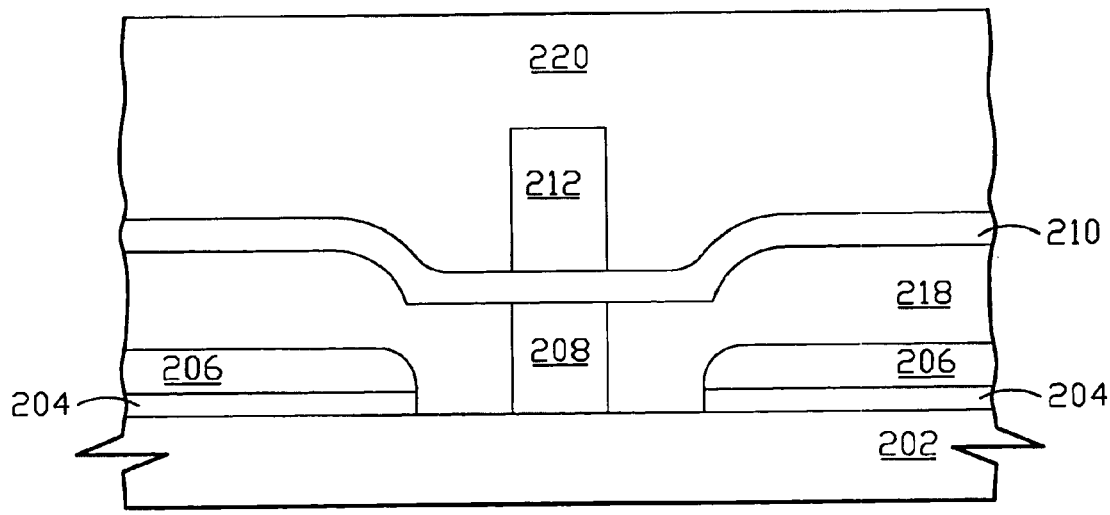
Figure 2D:
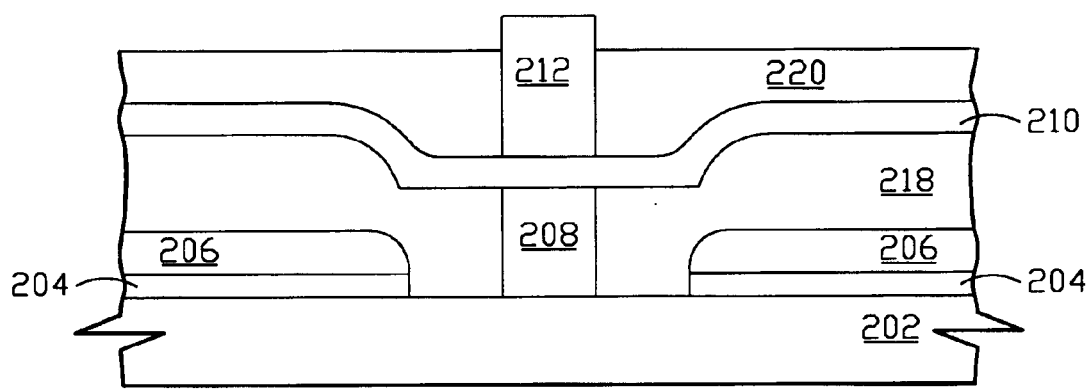
Figure 2E:
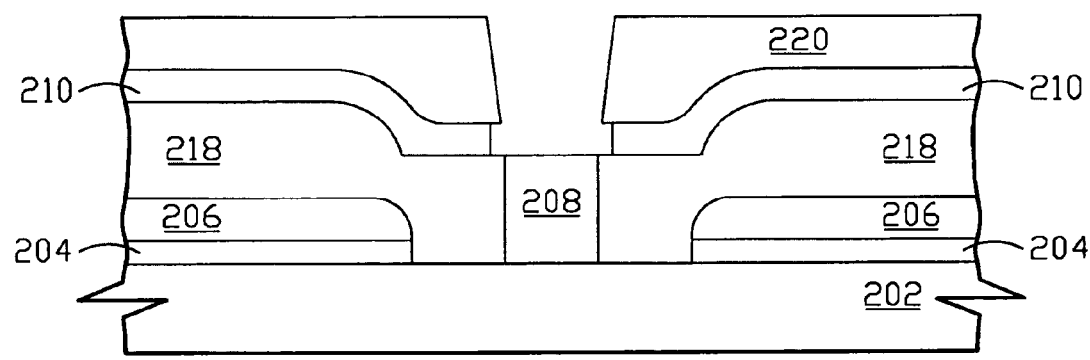

Referring to FIG. 2B, the BARC layer 214 and the layer 212 are etched to expose the oxide layer 210 by using the line pattern 216 as an etching mask. Then an ion implantation process is performed to form a first extrinsic base region 218 in the base layer 208 by using the line pattern 216 as an implantation mask. FIG. 2C shows a result of stripping the line pattern 216 and forming a dielectric layer 220 over the layer 212 and the oxide layer 210. The dielectric layer 220 comprises a SiN layer. The dielectric layer 220 is then planarized by a chemical mechanical polishing process and is further etched back to expose the layer 212 as shown in FIG. 2D. Then the layer 212 is removed to expose the oxide layer 210 and the exposed oxide layer 210 is etched to expose the base layer 208 as shown in FIG. 2E.

Figure 2F:
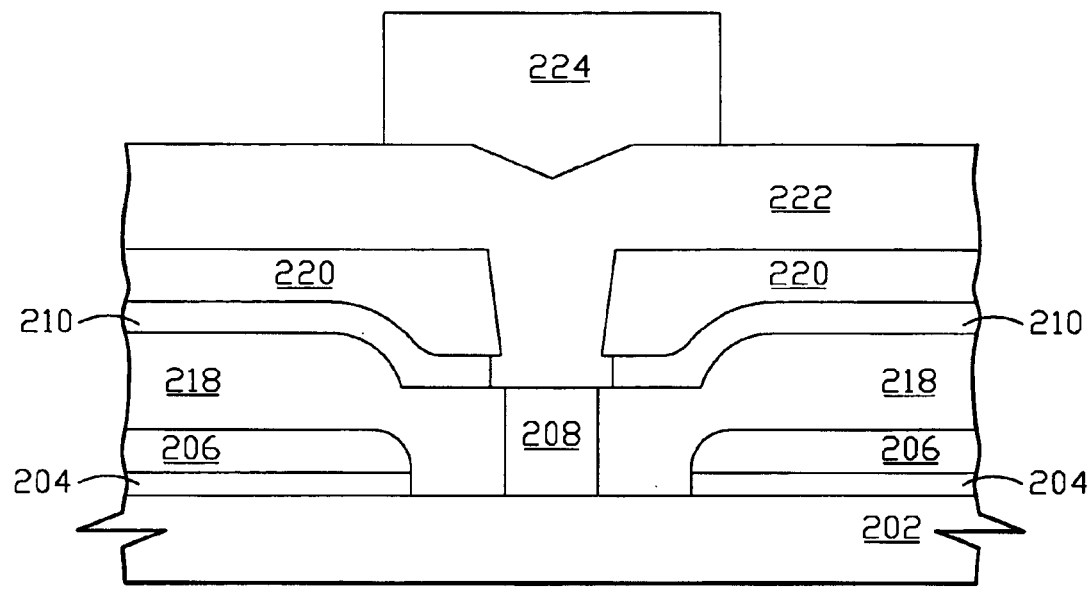
Figure 2G:
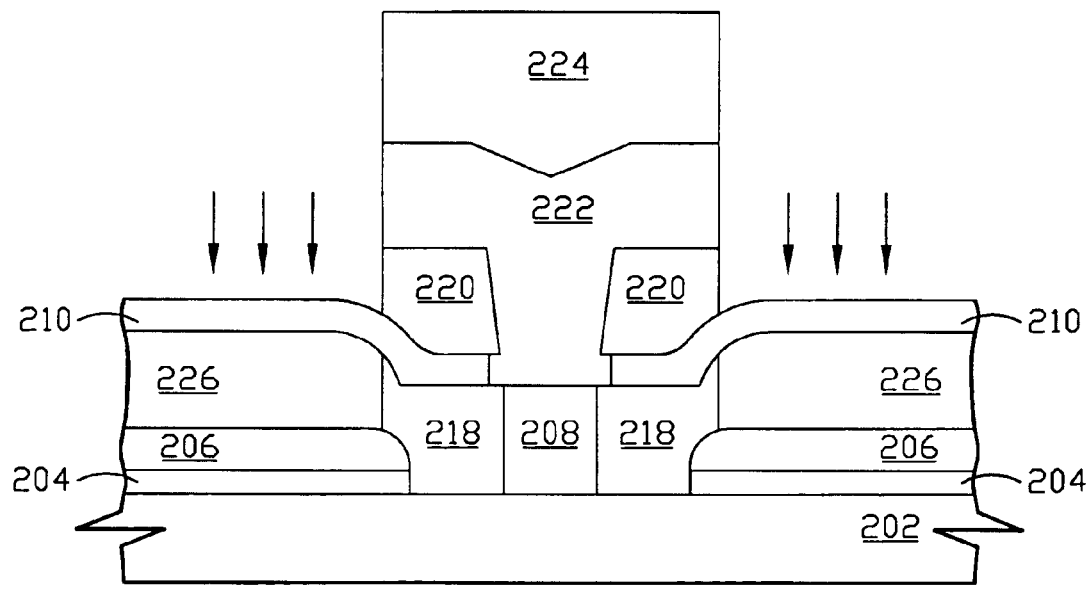
Figure 2H:
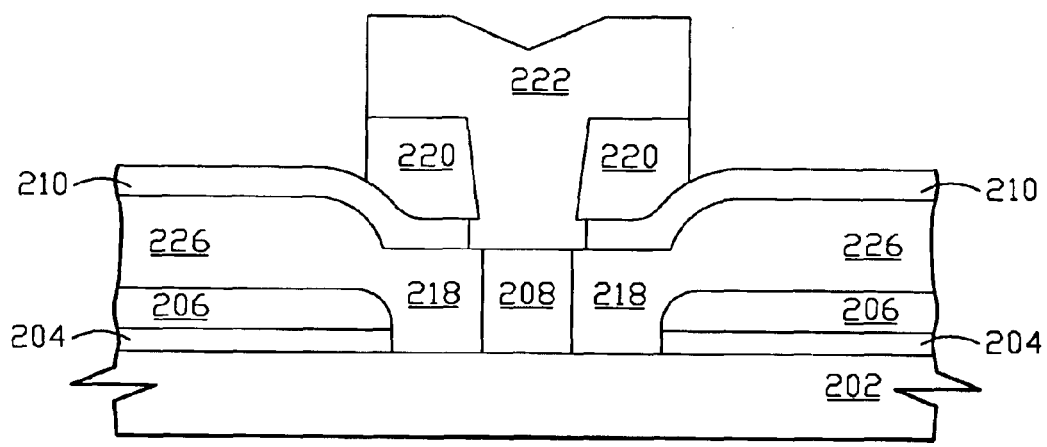

Referring to FIG. 2F, an emitter layer 222 is formed over the dielectric layer 220 and the base layer 208. Then a photoresist layer is formed on the emitter layer 222 and is patterned to form an emitter pattern 224. The emitter layer 222 and the dielectric layer 220 are etched to expose the oxide layer 210 by using the emitter pattern 224 as an etching mask as shown in FIG. 2G. Then an ion implantation process is performed to form a second extrinsic base region 226, and the base layer comprises an intrinsic base region 208, the first extrinsic base region 218 and the second extrinsic base region 226. Finally, the emitter pattern 224 is removed as shown in FIG. 2H.

The invention uses ISSG oxide instead of conventional PECVD oxide so that the base/emitter interface damage can be reduced. Moreover, the invention replaces the conventional emitter-window/space mask with an emitter-window reverse-tone mask/line mask to minimize the critical dimension of emitter window. Furthermore, the invention also utilizes a two-steps extrinsic base implantation to form two extrinsic bases with different dopant concentrations so that the base resistance can be reduced.

Figure 3A:
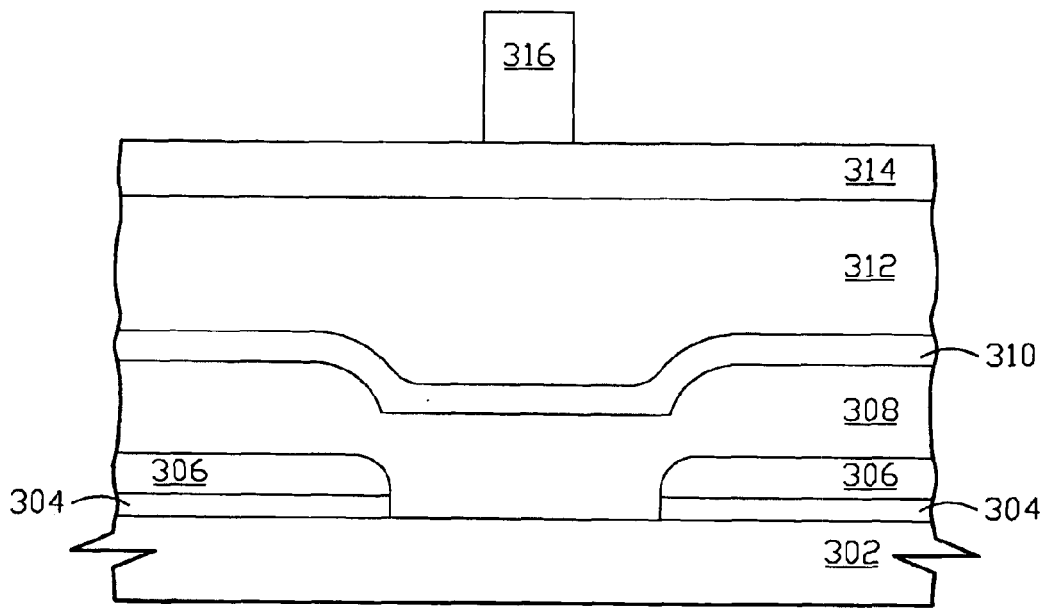
FIGS. 3A to 3H show process steps of another embodiment this invention.

In another embodiment of this invention, another fabrication method for heterojunction bipolar transistor (HBT) emitter/emitter window is provided. First of all, a substrate 302 having a collector therein is provided as shown in FIG. 3A. The substrate 302 comprises a p-type epitaxial silicon substrate. Then a dielectric layer 304 and a layer 306 are sequentially formed on the substrate 302. The layer 306 comprises a polysilicon layer. Next a window is formed to expose the substrate 302 by patterning and etching the dielectric layer 304 and the layer 306. Then a base layer 308 is formed over the layer 306 and to fill the window. The base layer 308 comprises a silicon germanium (SiGe) layer. Then a clean process by using a HF solution can be performed on the base layer 308. Next a first emitter layer 310 is formed over the base layer 308. The first emitter layer 310 comprises an undoped polysilicon layer. Then a dielectric layer 312 used as a hard mask is formed over the first emitter layer 310. The dielectric layer 312 comprises a TEOS (Tetra Ethyl Ortho Silicate Glass) layer. Next a bottom anti-reflecting coating (BARC) layer 314 is formed over the dielectric layer 312. Finally, a photoresist layer is formed on the BARC layer 314 and is patterned a line pattern 316. The line pattern 316 is formed by using a reverse-tone mask. The reverse-tone mask comprises photo masks used to expose photoresist layers and form line patterns of circuit lead line of integrated circuit.

Figure 3B:
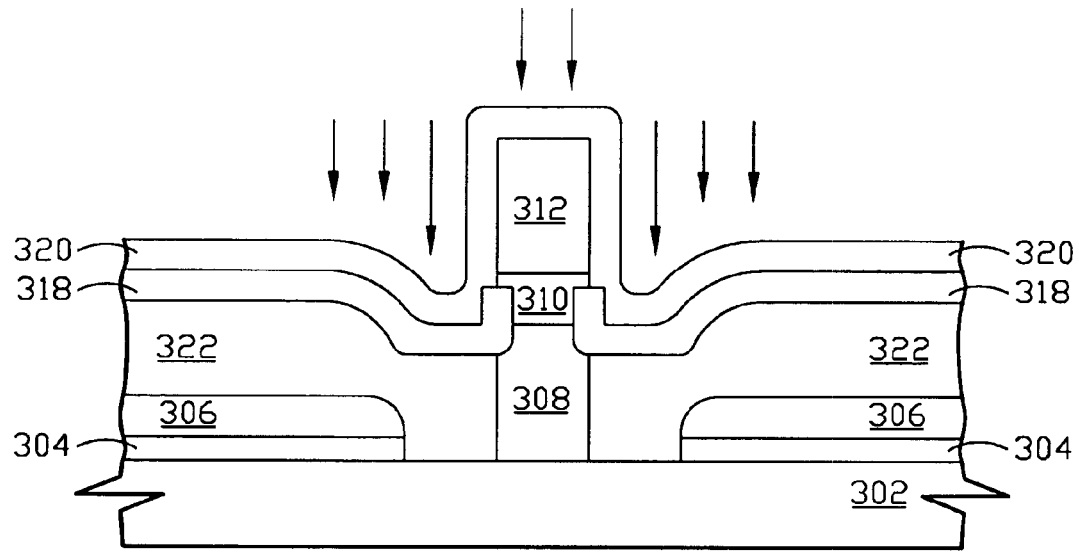

Referring to FIG. 3B, the BARC layer 314, the dielectric layer 312 and the first emitter layer 310 are etched to expose the base layer 308. Then the line pattern 316 and the BARC layer 314 are stripped. Next an oxide layer 318 is formed over the base layer 308 and the first emitter layer 310. The oxide layer 318 comprises an in situ steam generation (ISSG) oxide layer grew on a SiGe layer and a polysilicon layer. Then a linear oxide layer 320 is formed over the oxide layer 318 and the dielectric layer 312. Finally, a first ion implantation process is performed to form a first extrinsic base region 322.

Figure 3C:
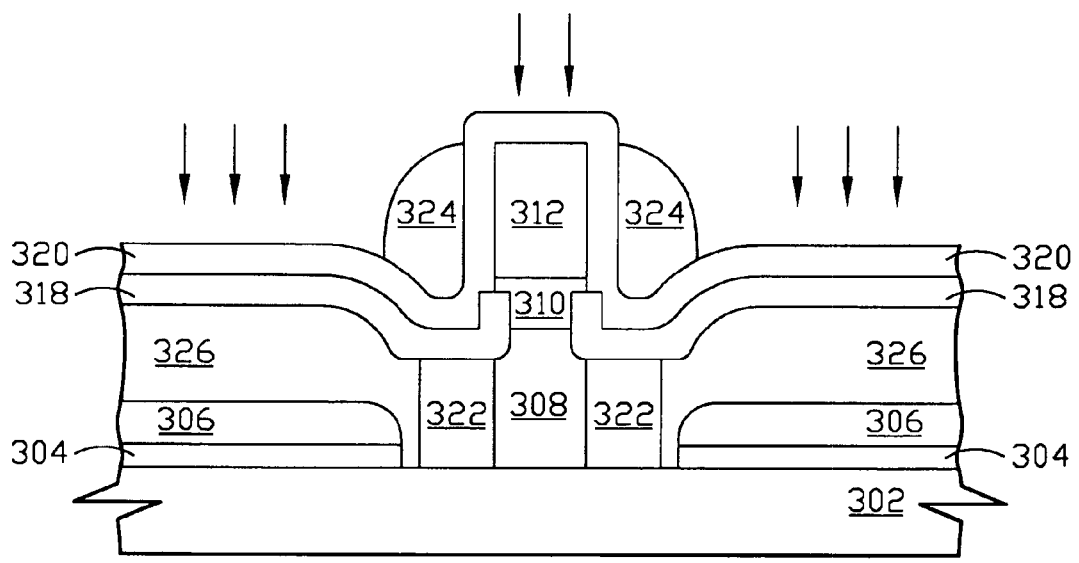
Figure 3D:
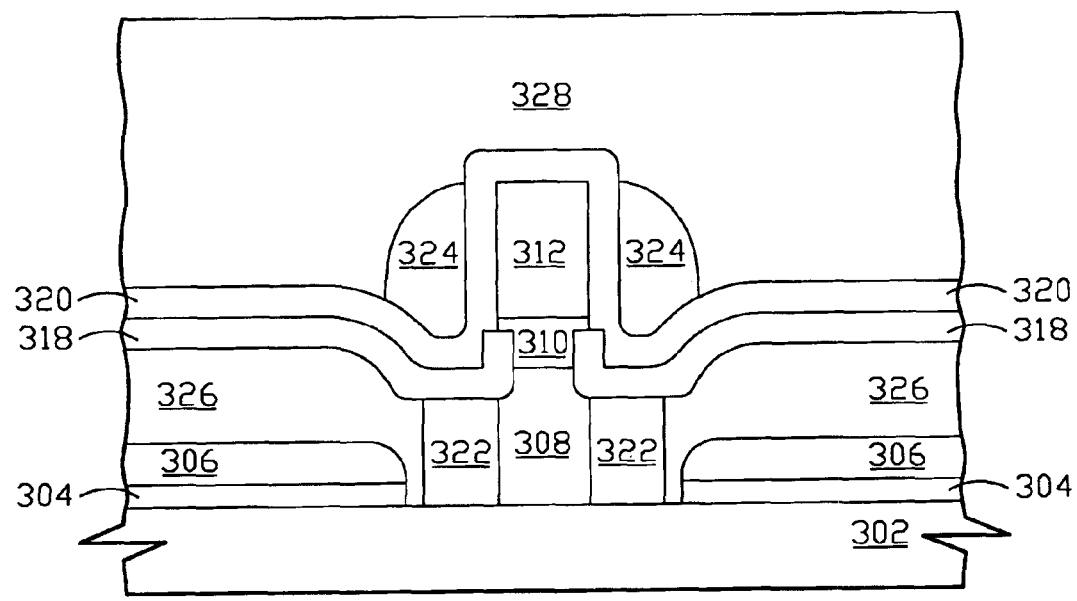
Figure 3E:
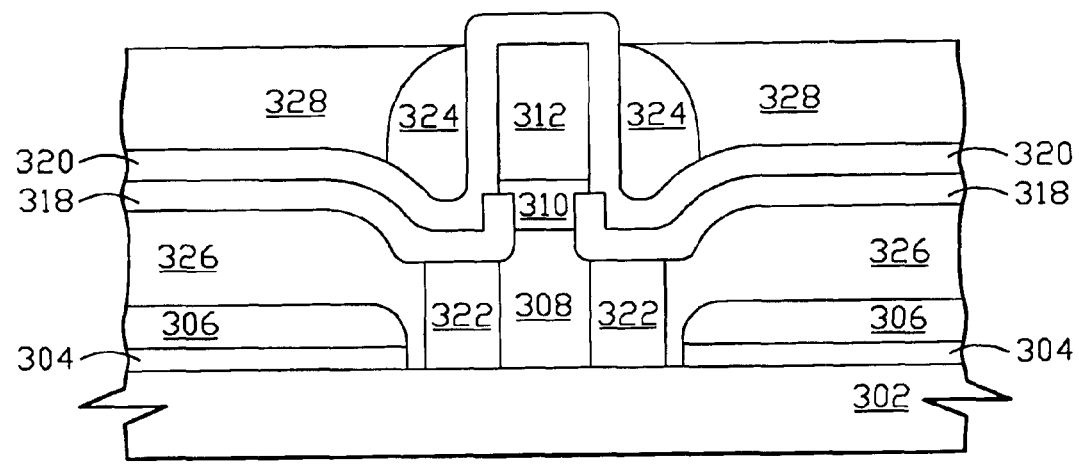

Referring to FIG. 3C, a dielectric layer is formed over the linear oxide layer 320 and is etched to form a spacer 324. Then a second ion implantation process is performed to form a second extrinsic base region 326. Then referring to FIG. 3D, a dielectric layer 328 is formed over the linear oxide layer 320 and the spacer 324. The dielectric layer 328 comprises a SiN layer. The dielectric layer 328 is then planarized by a chemical mechanical polishing process and is etched back to expose the linear oxide layer 320 as shown in FIG. 3E.

Figure 3F:
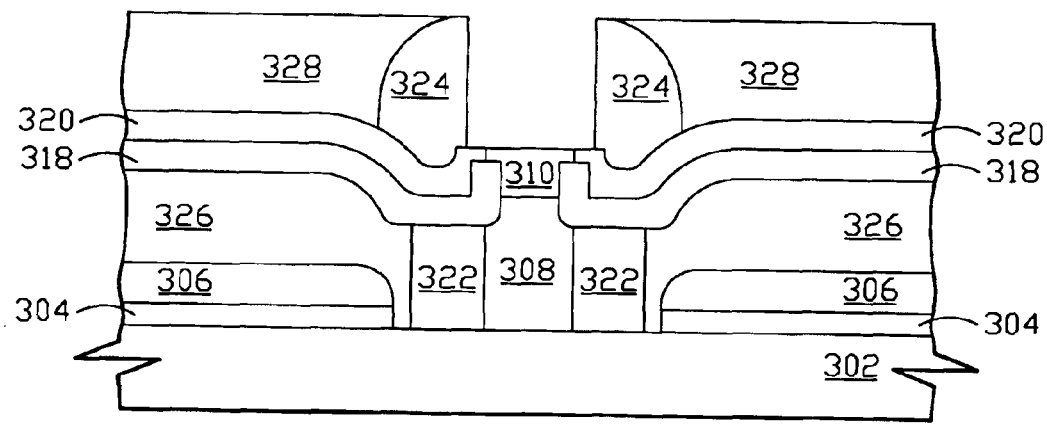
Figure 3G:
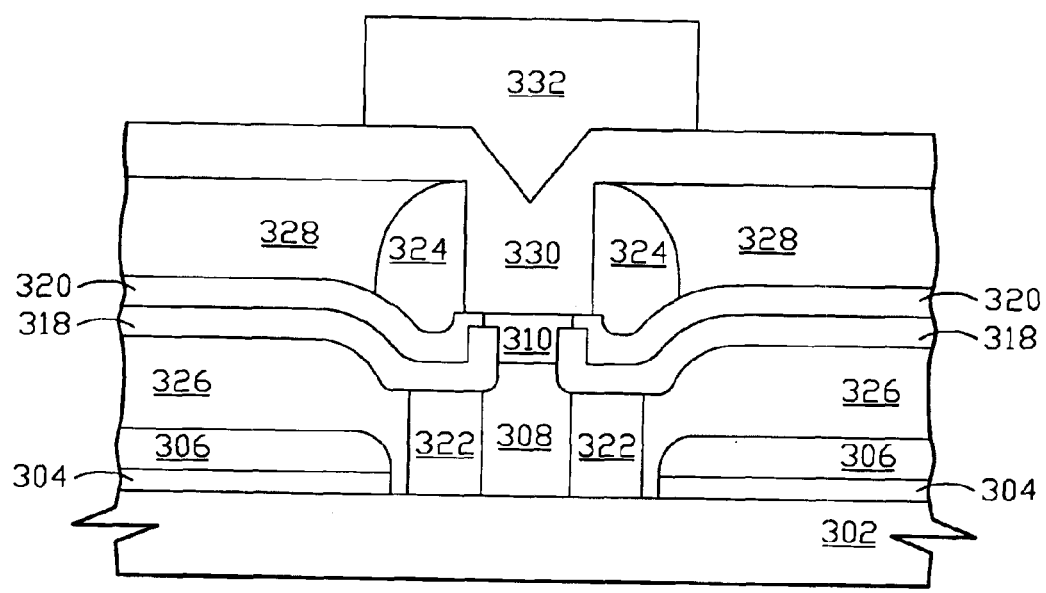
Figure 3H:
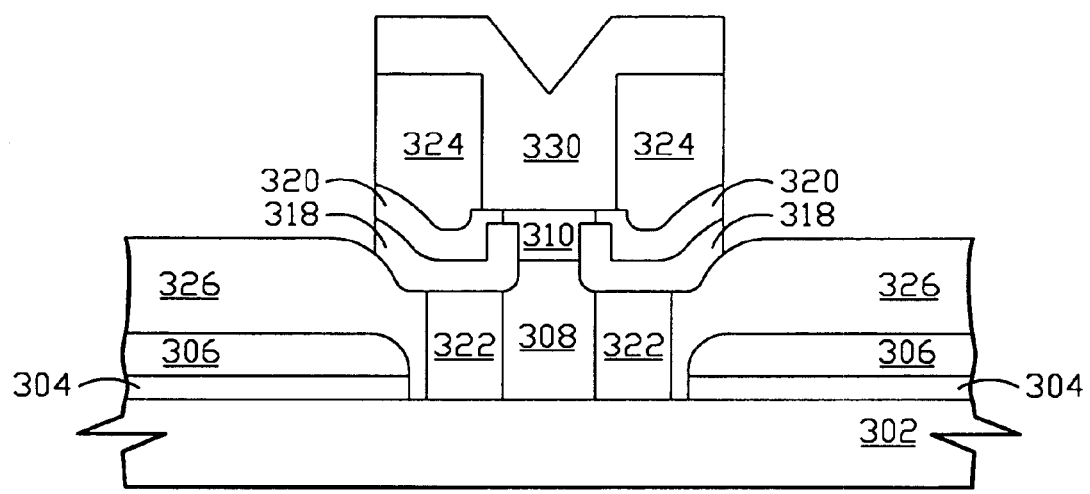

Referring to FIG. 3F, the exposed linear oxide layer 320 and the dielectric layer 312 are removed to expose the first emitter layer 310. Then a second emitter layer 330 is formed over the dielectric layers 324 and 328 and the exposed first emitter layer 310. Next a photoresist layer is formed on the second emitter layer 330 and is patterned to form a line pattern 332 as shown in FIG. 3G. The line pattern 332 is formed by using a reverse-tone mask. The reverse-tone mask comprises photo masks used to expose photoresist layers and form line patterns of circuit lead line of integrated circuit. Then the second emitter layer 330, the dielectric layer 328, the linear oxide layer 320 and the oxide layer 318 are etched by using the line pattern 332 as an etching mask to expose the second extrinsic base region 326. Finally, a heterojunction bipolar transistor of the invention is formed as shown in FIG. 3H. The heterojunction bipolar transistor comprising a substrate having a collector therein, an intrinsic base region, a first extrinsic base region, a second extrinsic base region, an emitter on the intrinsic base layer and a spacer adjacent the emitter and on the first extrinsic base region. The first extrinsic base region is adjacent the intrinsic base region and the second extrinsic base region is adjacent the first extrinsic base region on the substrate, wherein a dopant concentration of the second extrinsic base region is higher than a dopant concentration of the first extrinsic base region.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A fabrication method for heterojunction bipolar transistor, said method comprising:

providing a substrate having a collector therein, a base layer over said substrate, an oxide layer over said base layer, and a polysilicon layer over said oxide layer;

forming a first photoresist layer over said polysilicon layer;

transferring a line pattern into said first photoresist layer by a photo mask with said line pattern to form a emitter window pattern;

etching said polysilicon layer to expose said oxide layer by using said emitter window pattern as an etching mask;

performing a first ion implantation process into said base layer to form a first extrinsic base region therein;

removing said emitter window pattern;

forming a dielectric layer over said polysilicon layer and said oxide layer;

thinning said dielectric layer to expose said polysilicon layer;

removing said polysilicon layer to expose said oxide layer;

etching said exposed oxide layer to expose said base layer;

forming an emitter layer over said base layer and said dielectric layer;

forming a second photoresist layer over said emitter layer;

transferring an emitter pattern into said second photoresist layer;

etching said emitter layer to form an emitter and expose said oxide layer by using said emitter pattern as an etching mask; and performing a second ion implantation process to form a second extrinsic base region.

2. The method according to claim 1, wherein said oxide layer comprises an in situ steam generation oxide layer.

3. The method according to claim 1, further comprising a step of forming a bottom anti-reflecting coating layer over said polysilicon layer.

4. The method according to claim 1, wherein said polysilicon layer comprises an undoped polysilicon layer.

5. The method according to claim 1, wherein said dielectric layer comprises a SiN layer.

6. The method according to claim 1, wherein said dielectric layer is thinned by a chemical mechanical polishing and an etching back processes.

7. The method according to claim 1, wherein said base layer comprises a SiGe layer.

8. A fabrication method for heterojunction bipolar transistor, said method comprising:

providing a substrate having a collector therein, a base layer over said substrate, a first emitter layer over said base layer, and a first dielectric layer over said first emitter layer;

forming a first photoresist layer over said first dielectric layer;

transferring a line pattern into said first photoresist layer by a photo mask with said line pattern to form a emitter window pattern;

etching said first dielectric layer to expose said first emitter layer by using said emitter window pattern as an etching mask;

removing said emitter window pattern;

etching said first emitter layer to expose said base layer;

forming a first oxide layer over said base layer and said first emitter layer;

forming a second oxide over said first dielectric layer and said first oxide layer;

performing a first ion implantation process into said base layer to form a first extrinsic base region therein;

forming a second dielectric layer over said second oxide layer;

anisotropically etching said second dielectric layer to expose said second oxide layer and form a spacer;

performing a second ion implantation process to form a second extrinsic base region;

forming a third dielectric layer over said second oxide layer and said spacer;

thinning said third dielectric layer to expose said second oxide layer;

removing said exposed second oxide layer and said first dielectric layer to expose said first emitter layer;

forming a second emitter layer over said first emitter layer and said third dielectric layer;

forming a second photoresist layer over said second emitter layer;

transferring an emitter pattern into said second photoresist layer;

and etching said second emitter layer, said third dielectric layer, said second oxide layer and said first oxide layer to form an emitter and expose said second extrinsic base region.

9. The method according to claim 8, wherein said base layer comprises a SiGe layer.

10. The method according to claim 8, wherein said first dielectric layer comprises a Tetra Ethyl Ortho Silicate Glass (TEOS) layer.

11. The method according to claim 8, further comprising a step of forming a bottom anti-reflecting coating layer over said first dielectric layer.

12. The method according to claim 8, wherein said first oxide layer comprises an in situ steam generation oxide layer.

13. The method according to claim 8, wherein said second oxide layer comprises a linear oxide layer.

14. The method according to claim 8, wherein said second dielectric layer comprises a SiN layer.

15. The method according to claim 8, wherein said third dielectric layer comprises a SiN layer.

16. The method according to claim 8, wherein said third dielectric layer is thinned by a chemical mechanical polishing and an etching back processes.

* * * * *